(12) United States Patent
Lvovsky et al.

(10) Patent No.: US 8,542,015 B2
(45) Date of Patent: Sep. 24, 2013

(54) APPARATUS AND METHOD FOR PROTECTING A MAGNETIC RESONANCE IMAGING MAGNET DURING QUENCH

(75) Inventors: Yuri Lvovsky, Florence, SC (US); Weijun Shen, Florence, SC (US); Jian-She Wang, Florence, SC (US)

(73) Assignee: General Electric Company, Schenectady, NY (US)

( * ) Notice: Subject to any disclaimer, the term of this patent is extended or adjusted under 35 U.S.C. 154(b) by 303 days.

(21) Appl. No.: 13/009,407

(22) Filed: Jan. 19, 2011

(65) Prior Publication Data
US 2012/0182012 A1    Jul. 19, 2012

(51) Int. Cl.
*G01V 3/00* (2006.01)
(52) U.S. Cl.
USPC .......................................... 324/318; 324/319
(58) Field of Classification Search
USPC ................ 324/318, 319, 320; 361/19, 24
See application file for complete search history.

(56) References Cited

U.S. PATENT DOCUMENTS

| 4,689,439 | A |   | 8/1987  | Sato |   |
|---|---|---|---|---|---|
| 5,644,218 | A | * | 7/1997  | Emmerich et al. | 323/360 |
| 5,999,383 | A | * | 12/1999 | Hall et al. | 361/19 |
| 6,445,555 | B1 |   | 9/2002  | Buckles et al. |   |
| 7,342,757 | B2 | * | 3/2008  | Huang et al. | 361/23 |
| 7,649,720 | B2 | * | 1/2010  | Markiewicz | 361/19 |

FOREIGN PATENT DOCUMENTS

| GB | 2429293 A | 2/2007 |
| GB | 2471325 A | 12/2010 |
| GB | 2471705 A | 1/2011 |

OTHER PUBLICATIONS

Search Report from corresponding GB Application No. GB1200431.3 dated May 9, 2012.

* cited by examiner

*Primary Examiner* — Louis Arana
(74) *Attorney, Agent, or Firm* — Ziolkowski Patent Solutions Group, SC

(57) ABSTRACT

A superconducting magnet assembly comprising a plurality of superconducting magnet coil portions forming a coil series circuit to provide a magnetic field, a power supply to supply power to the plurality of superconducting magnet coil portions during a magnet ramp mode of operation, and a ramp switch coupled to the superconducting magnet coil portions, wherein the ramp switch is configured to be open during a magnet ramp mode and closed during a persistent mode. A dump resistor is disposed externally to the vessel and is connectable by the ramp switch to the superconducting magnet coil portions. Further, a controller is coupled to at least one superconducting magnet coil portion and the ramp switch and is configured to detect a quench onset condition in the at least one superconducting magnet coil portion and to open the ramp switch upon detection of the quench onset condition in order to dump magnet energy.

23 Claims, 2 Drawing Sheets

APPARATUS AND METHOD FOR PROTECTING A MAGNETIC RESONANCE IMAGING MAGNET DURING QUENCH

BACKGROUND OF THE INVENTION

Embodiments of the invention relate generally to a superconducting magnet assembly for magnetic resonance imaging (MRI), and more particularly to the protection of the superconducting magnetic assembly in the event of quenching of superconducting operation using an external dump resistor.

As is well known, magnet coils wound of superconductive material can be made superconducting when placed in an extremely cold environment. For example, magnet coils may be made superconducting when enclosed in a cryostat or similar pressure vessel containing a cryogen. The low operating temperature enables the superconducting wires of the magnet coils to be in a superconducting state, wherein the resistance of the wires is essentially zero. A power source may be connected to the coils for a period of time to ramp the current up or down through the coils, and the lack of electrical resistance in the coils enables current to continue to flow therethrough after the power source has been disconnected from the coils. Such constant current flow through the superconducting magnet without noticeable decay is known as a "persistent" mode of operation, which has seen wide application in a variety of fields, particularly MRI.

In a typical MRI magnet, the main superconducting magnetic coils are enclosed in a cryogen pressure vessel, which itself is contained within a vacuum vessel. An axial imaging bore is formed in the center of the vacuum vessel, wherein the main magnet coils produce strong magnetic field in the imaging volume of the axial imaging bore. A common cryogen utilized within the cryogen pressure vessel is liquid helium. During superconducting operation, liquid helium boils to form helium gas, which is either recondensed for recycling or vented to the atmosphere.

A primary concern in superconducting magnet assemblies is the discontinuance, or "quenching", of the superconducting operation, which may produce undesirable voltages and temperatures within the magnet. A quench event occurs when an energy disturbance, such as from magnet coil frictional movement, heats a section of superconducting wire and raises the temperature of the superconducting wire above the critical level where the wire loses its superconducting state. The heated section of the wire becomes resistive, and the heating further raises the temperature of the section of wire and propagates to adjacent areas, thereby increasing the size of the normal section. Irreversible quench then occurs, wherein the electromagnetic energy of the magnet must either be quickly dumped or converted into thermal energy.

Sudden quenching of superconducting operation can cause sharp temperature rises, which can in turn damage the superconducting wires. In addition, the rapid decrease in the molecular density within the cryogen vessel resulting from such a sharp temperature rise reduces the ability of the cryogen gas to properly insulate the surrounding components, thereby resulting in possible voltage breakdown. Furthermore, the liquid helium or other cryogen used within the cryogen vessel rapidly becomes gaseous as the temperature within the cryogen vessel increases, and this gas (with rapidly increasing pressure) must be vented from the cryogen vessel, thereby resulting in the loss of a substantial amount of the costly cryogen. Such a quench also leads to significant downtime in the use of the MRI scanner, as the superconducting magnet must be given significant time to re-cool and re-ramp after quench.

Advantageously, after each quench of a superconducting magnet, the magnet usually shows progressive improvement in performance. This phenomenon, known as "training", enables the magnet to settle into substantially constant performance after a series of training quenches such that the magnet eventually quenches at currents that are appreciably higher than the initial quench current. Accordingly, training quenches are a common phenomenon taking place during manufacture of superconducting magnet assemblies for MRI. The magnets are trained to above the operating current to decrease the likelihood of quenches occurring when the magnet assembly is operating in a persistent mode in the field. However, these training quenches still involve the undesirable loss of expensive cryogen, extensive system downtime, and potential component damage associated with conventional quenching, as discussed above. Selection of the magnet design parameters, specifically the fraction of critical current at which the magnet operates, depends on the magnet stability and amount of training quenches. More aggressive magnet designs that would operate closer to the critical current, employ less superconductor, and have lower cost would be enabled if the consequences of training quenches were eliminated or reduced.

It would therefore be desirable to have an apparatus and method capable of providing quench protection to a superconducting magnetic assembly without losing significant amounts of a cryogen, and without experiencing extensive system downtime to allow for magnet re-cooling.

BRIEF DESCRIPTION OF THE INVENTION

Embodiments of the invention provide a superconducting magnet assembly comprising a plurality of superconducting magnet coil portions connected in series to form a coil series circuit within a vessel to provide a magnetic field, a power supply coupled to the plurality of superconducting magnet coil portions to supply power to the plurality of superconducting magnet coil portions during a magnet ramp mode of operation, and a ramp switch disposed within the vessel and coupled to the plurality of superconducting magnet coil portions, wherein the ramp switch is configured to be open during a magnet ramp mode of operation and closed during a persistent mode of operation. The superconducting magnet assembly further comprises a dump resistor disposed externally to the vessel, wherein the dump resistor is connectable by the ramp switch to the plurality of superconducting magnet coil portions, and a controller coupled to at least one superconducting magnet coil portion and the ramp switch, wherein the controller is configured to detect a quench onset condition based upon a signal detected from the at least one superconducting magnet coil portion and to open the ramp switch upon detection of the quench onset condition in order to dump magnet energy to the dump resistor.

In accordance with another aspect of the invention, a method of protecting a superconducting magnet assembly during a quench condition is disclosed, the method comprising coupling a controller to at least one superconducting magnet coil portion disposed within a vessel, connecting the at least one superconducting magnet coil portion to a power supply during a magnet ramp mode of operation and connecting the at least one superconducting magnet coil portion to a dump resistor during a persistent mode of operation, and monitoring signal from at least one superconducting magnet coil portion to detect the onset of a quench condition. The method further comprises detecting the quench condition based on the monitored signal, and sending a signal from the controller to a ramp switch coupled to the at least one superconducting magnet coil portion to open the ramp switch if a quench condition is detected by the controller in order to discontinue a persistent mode of operation and in order to connect the at least one superconducting magnet coil portion to the dump resistor.

In accordance with yet another aspect of the invention, a magnetic resonance imaging system is disclosed, the system comprising a superconducting magnet coil assembly disposed within a vessel, a power supply disposed externally to the vessel, wherein the power supply is removably coupleable to the superconducting magnet coil assembly via permanently embedded leads in the vessel, and a ramp switch disposed within the vessel and coupled to the superconducting magnet coil assembly, wherein the ramp switch is configured to be open during a magnet ramp mode of operation and closed during persistent mode of operation. The magnetic resonance imaging system further comprises an external dump resistor disposed externally to the vessel, wherein the external dump resistor is coupled to the superconducting magnet coil assembly via cables coupled to the permanently embedded leads in the vessel, and a quench protection controller disposed externally to the vessel and coupled to the superconducting magnet coil assembly and the ramp switch, wherein the quench protection controller is configured to detect a quench condition based upon measured signals of the superconducting magnet coil assembly and to open the ramp switch in order to dump magnet energy to the external dump resistor when a quench condition is detected.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

A system and method are shown to provide quench protection to a superconducting magnetic assembly without a significant loss of cryogen and without extensive system downtime. The system and method are particularly useful in magnetic resonance imaging (MRI) applications, including smaller dedicated MRI magnets (e.g., head, ortho).

Figure 1:
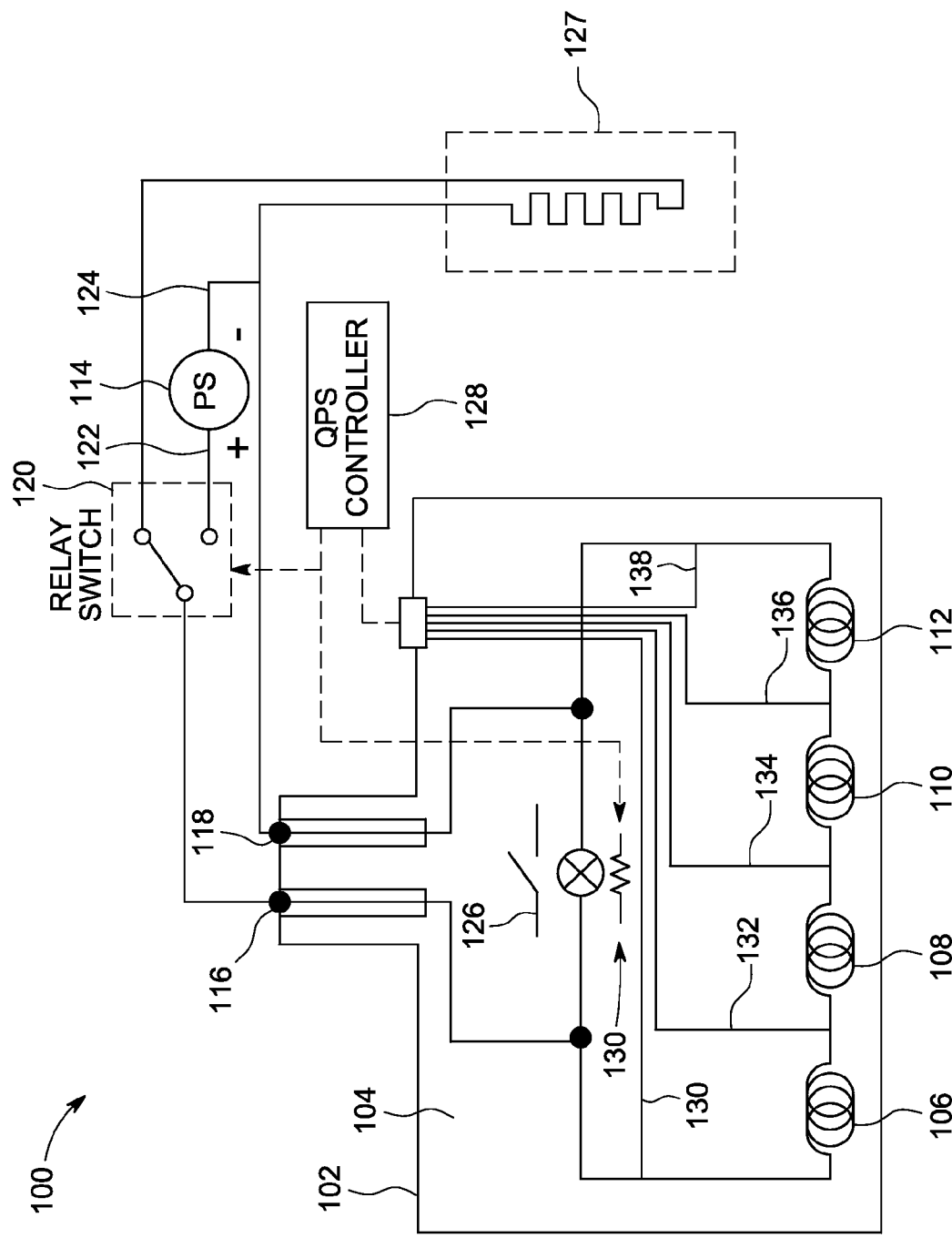
FIG. 1 is a schematic diagram of a superconducting magnetic assembly in accordance with an embodiment of the invention.

Referring to FIG. 1, a superconducting magnetic assembly 100 in accordance with an embodiment of the invention is shown. Superconducting magnetic assembly 100 comprises a cryogen pressure vessel 102 filled with a cryogen 104 (e.g., liquid helium) so as to provide cooling to components within cryogen pressure vessel 102. While not shown in FIG. 1, it is to be understood that cryogen pressure vessel 102 may be cylindrically formed to have a central bore portion therethrough, which acts as a central imaging bore in MRI applications. However, the invention is not limited to applications having such a cylindrical geometry with central imaging bore, and cryogen pressure vessel 102 may be formed in any suitable manner for containment of superconducting magnet coils therein. Furthermore, it is to be understood that the vessel does not have to be filled with a cryogen, but could instead house a conduction-cooled superconducting magnetic assembly. Alternatively, a superconducting magnet assembly could be cooled by a closed cryogen loop.

A plurality of superconducting magnet coil portions 106, 108, 110, 112 are coupled in series and disposed within cryogen pressure vessel 102. The number of superconducting magnet coil portions illustrated in FIG. 1 is merely exemplary, and more or fewer coil portions could be utilized in accordance with the invention. During a magnet ramp mode of operation (i.e., when a magnet is charged to full current), superconducting magnet coil portions 106, 108, 110, 112 are electrically connected to a power supply 114 via a pair of permanently embedded leads 116, 118 in cryogen pressure vessel 102. Power supply 114 may be permanently affixed in superconducting magnetic assembly 100 or may be removably coupleable to act as a service tool only during a magnet ramp mode. A relay switch 120 is actively positioned so as to couple a positive terminal 122 of power supply 114 to permanently embedded lead 116 and a negative terminal 124 of power supply 114 to permanently embedded lead 118. Relay switch 120 may be any appropriate switch, e.g., MGBT-based or mechanical. Using this configuration during magnet ramp mode of operation, superconducting magnet coil portions 106, 108, 110, 112 are energized to form a coil series circuit capable of providing a magnetic field in the central imaging bore of cryogen pressure vessel 102.

After superconducting magnet coil portions 106, 108, 110, 112 have been charged to full current by power supply 114 in a magnet ramp mode of operation, a main ramp switch 126 electrically coupled to superconducting magnet coil portions 106, 108, 110, 112 is switched from an "open" to a "closed" position such that main ramp switch 126 connects the lead to an external dump resistor 127 as opposed to power supply 114. When main ramp switch 126 is in the "closed" position, current is able to circulate through the coil series circuit formed by superconducting magnet coil portions 106, 108, 110, 112 without the need for continuous connection to power supply 114. Such operation is known as a "persistent" mode of operation. If resistances in the coil series circuit are minimal, the magnet system is capable of operation in a persistent mode for a substantial period of time, thereby reducing energy demands, potential losses associated with continuous connection to an external power supply, and enabling the required high stability of the central field $B_0$.

Additionally, when superconducting magnet coil portions 106, 108, 110, 112 are detected to be operating in a persistent mode (i.e., main ramp switch 126 is in the "closed" position), relay switch 120 is activated so as to decouple power supply 114 from permanently embedded lead 116, instead coupling permanently embedded lead 116 to external dump resistor 127. The properties and operation of external dump resistor 127 will be described in further detail hereinbelow.

As noted above, superconducting magnetic assembly 100 is capable of operation in a persistent mode when superconducting magnet coil portions 106, 108, 110, 112 have been charged to their full operating current. However, quenching of superconducting magnetic assembly 100 may occur during persistent mode of operation, wherein such quenching may raise the temperature of components of superconducting magnet coil portions 106, 108, 110, 112 above the critical temperature of superconducting operation. Accordingly, in order to mitigate undesired quench, superconducting magnetic assembly 100 further includes a quench protection system comprising a quench protection controller 128. Quench protection controller 128 is disposed externally to, and is permanently coupled to, cryogen pressure vessel 102. Quench protection controller 128 is in electrical communication with superconducting magnet coil portions 106, 108, 110, 112 via a plurality of voltage taps 130, 132, 134, 136, 138. However, it is to be recognized that quench detection is not limited to voltage detection by the voltage taps. Alternately, it can incorporate other means, including mechanical, inductive, optical, thermal or other mechanisms and sensors to detect onset of quench event.

During persistent mode of operation, quench protection controller 128 is configured to monitor the voltage levels of superconducting magnet coil portions 106, 108, 110, 112 via voltage taps 130, 132, 134, 136, 138, or other signals from a quench detection sensor. Based on these voltage levels (or other sensor signals), quench protection controller 128 detects whether or not a quench condition has occurred. If no quench condition is detected, system operation is not altered and the persistent mode continues. However, if a quench condition is detected, quench protection controller 128 is configured to send a pulse signal to a heater 130 disposed within main ramp switch 126, thereby opening main ramp switch 126. When main ramp switch 126 is opened, current flow through the closed coil series circuit formed by superconducting magnet coil portions 106, 108, 110, 112 is interrupted and current is rapidly discharged from superconducting magnet coil portions 106, 108, 110, 112 to external dump resistor 127 via embedded leads 116, 118. External dump resistor may comprise, for example, greater than 40 kg of steel, which may be located in a safety cage within an equipment room entirely separate from the imaging room housing cryogen pressure vessel 102 so as to effectively handle the rapid current discharge. In this way, quench protection controller 128 is capable of protecting all components within cryogen pressure vessel 102 from a quench condition detected during persistent operation, and is capable of doing so without a substantial loss of cryogen (e.g., liquid helium) and/or excessive heating of superconducting magnet coil portions 106, 108, 110, 112 that conventionally necessitates costly cryogen replacement within the system, downtime of the system to allow for magnet re-cooling, and requires more superconductor in the magnet design.

While utilization of quench protection controller 128 during a persistent mode is described above, quench protection controller 128 is not limited to operation in such a mode. That is, during a magnet ramp mode of operation, quench protection controller 128 is similarly configured to monitor the voltage levels or equivalent quench detection signals of superconducting magnet coil portions 106, 108, 110, 112 via voltage taps 130, 132, 134, 136, 138 (or other sensors). However, as main ramp switch 126 is already open during a magnet ramp mode of operation, quench protection controller 128 does not need to operate to send a pulse signal to heater 130 to open main ramp switch 126 when a quench condition is detected. Instead, when a quench condition is detected during a magnet ramp mode, quench protection controller 128 is configured to send a pulse signal to relay switch 120, which decouples power supply 114 from permanently embedded lead 116 and couples external dump resistor 127 to permanently embedded lead 116. In forming this connection, current flow through superconducting magnet coil portions 106, 108, 110, 112 is interrupted and current is rapidly discharged from superconducting magnet coil portions 106, 108, 110, 112 to external dump resistor 127 via embedded leads 116, 118, as is similarly described above. Thus, quench protection controller 128 is equally capable of detecting and mitigating a quench condition during both a persistent mode of operation and a magnet ramp mode of operation.

In applications other than MRI (e.g., accelerator magnets), quench conditions have previously been mitigated through the use of an external dump resistor to quickly "dump" current for system protection. However, such applications do not operate in a persistent mode similar to that described above for MRI applications, and thus the use of an external dump resistor in an MRI application was not previously implemented.

Figure 2:
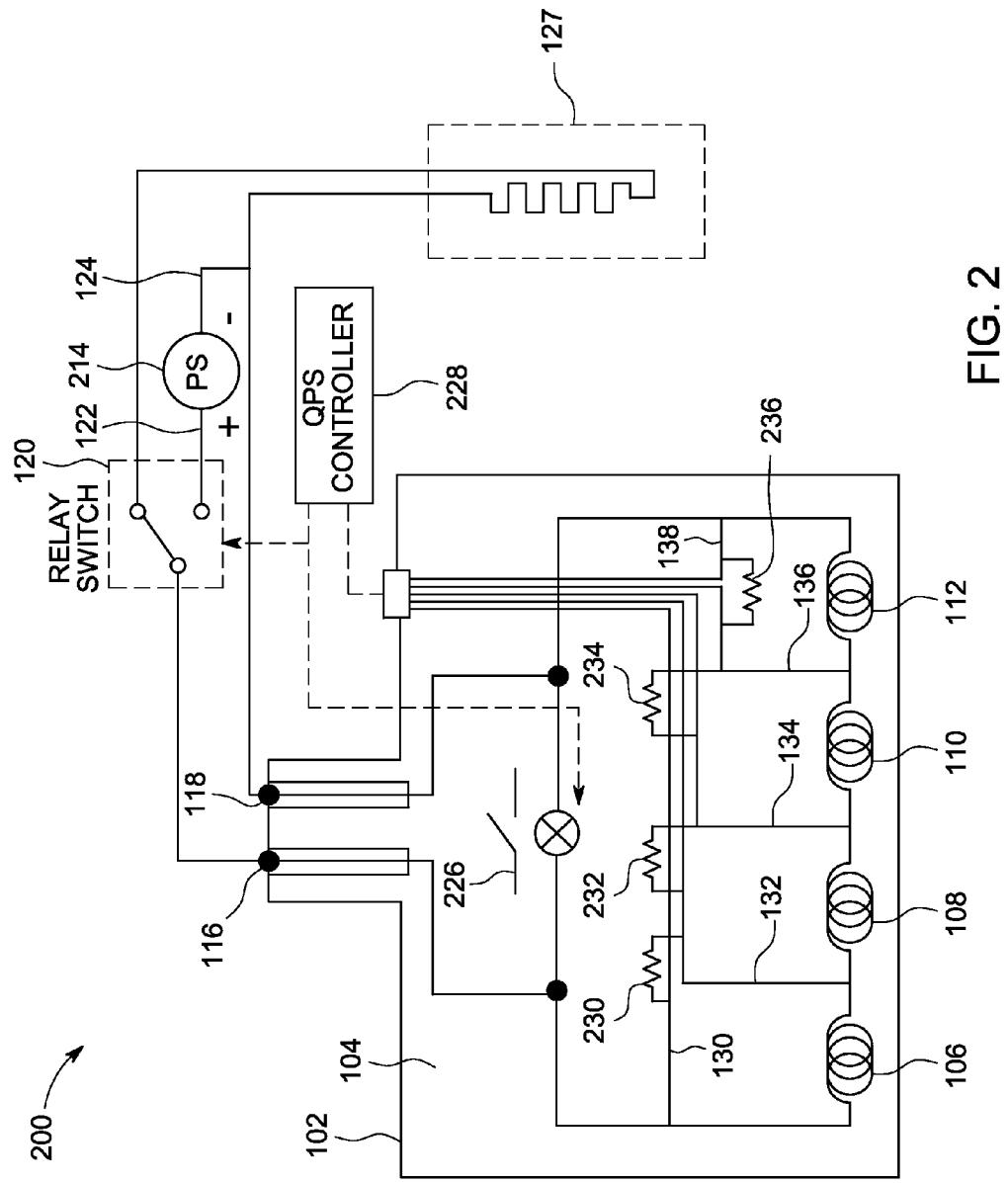
FIG. 2 is a schematic diagram of a superconducting magnetic assembly in accordance with another embodiment of the invention

Referring now to FIG. 2, a superconducting magnetic assembly 200 in accordance with another embodiment of the invention is shown. For ease of understanding, many of the same elements shown and described with respect to FIG. 1 are also shown in FIG. 2. Accordingly, their reference numbers will correlate between FIG. 1 and FIG. 2, and their purpose within superconducting magnetic assembly 200 will not be reiterated herein.

Superconducting magnetic assembly 200 illustrated in FIG. 2 comprises a quench protection controller 228 in communication with superconducting magnet coil portions 106, 108, 110, 112 via a plurality of voltage taps 130, 132, 134, 136, 138. However, unlike quench protection controller 128 described above with respect to FIG. 1, quench protection controller 228 is configured to be removably coupleable to cryogen pressure vessel 102. Specifically, quench protection controller 228 is configured to act as a service tool during a magnet ramp mode of operation, and thus may be removed from superconducting magnetic assembly 200 upon completion of the magnet ramp mode of operation. Additionally, power supply 214 shown in FIG. 2 is also configured to be removably coupleable to cryogen pressure vessel 102 and may similarly be removed from superconducting magnetic assembly 200 after completion of the magnet ramp mode of operation.

During a magnet ramp mode, quench protection controller 228 operates similarly to quench protection controller 128 described above with respect to FIG. 1. That is, quench protection controller 228 is configured to monitor the voltage levels of superconducting magnet coil portions 106, 108, 110, 112 via voltage taps 130, 132, 134, 136, 138. During the magnet ramp mode, main ramp switch 226 is in an open position, and thus quench protection controller 228 need not operate to send a pulse signal to a plurality of main ramp switch heaters 230, 232, 234, 236 to open main ramp switch 226 when a quench condition is detected. Instead, when a quench condition is detected during magnet ramp, quench protection controller 228 is configured to send a pulse signal to relay switch 120 to decouple power supply 214 from permanently embedded lead 116 and couple external dump resistor 127 to permanently embedded lead 116. As described above with respect to FIG. 1, forming the connection between permanently embedded lead 116 and external dump resistor 127 during the magnet ramp mode interrupts current flow through superconducting magnet coil portions 106, 108, 110, 112, causing the current to be rapidly discharged from superconducting magnet coil portions 106, 108, 110, 112 to external dump resistor 127 via embedded leads 116, 118.

As noted above, quench protection controller 228 and power supply 214 act as service tools and are ideally removed from superconducting magnetic assembly 200 upon completion of a magnet ramp mode. However, even with the removal of quench protection controller 228 subsequent to magnet ramp, superconducting magnetic assembly 200 is still configured to detect a quench condition when superconducting magnet coil portions 106, 108, 110, 112 are operating in a persistent mode.

During persistent mode, main ramp switch 226 is closed, enabling current to circulate through the coil series circuit formed by superconducting magnet coil portions 106, 108, 110, 112. Main ramp switch heaters 230, 232, 234, 236 are coupled to voltage taps 130, 132, 134, 136, 138, allowing for main ramp switch heaters 230, 232, 234, 236 to be driven by the voltage across superconducting magnet coil portions 106, 108, 110, 112. That is, if the voltage across any of superconducting magnet coil portions 106, 108, 110, 112 reaches a predetermined voltage level indicative of a quench condition, at least one of main ramp switch heaters 230, 232, 234, 236 is driven to open main ramp switch 226. With main ramp switch 226 open, current flow through the coil series circuit formed by superconducting magnet coil portions 106, 108, 110, 112 is interrupted and current is rapidly discharged from superconducting magnet coil portions 106, 108, 110, 112 to external dump resistor 127 via embedded leads 116, 118. Accordingly, quench protection during a persistent mode is realized in superconducting magnetic assembly 200, albeit without assistance from external quench protection controller 228.

While not explicitly illustrated in FIG. 1 and FIG. 2, it is to be understood that superconducting magnetic assembly 100 and superconducting magnetic assembly 200 may comprise additional components within a quench protection circuit, such as diodes, additional resistors, heaters, etc. Superconducting magnetic assembly 100 and superconducting magnetic assembly 200 may also comprise a differing number of coil loops, each of which combine several coils/coil portions into one loop.

By utilizing either superconducting magnetic assembly 100 or superconducting magnetic assembly 200 shown and described in FIG. 1 and FIG. 2, respectively, a lower-cost MRI magnet and low-loss (or no-loss) training of the MRI magnet is capable of being realized. Conventional MRI magnets are limited by stability considerations and must be initially designed at levels far less than critical current, only to be iteratively trained to a higher operating current over time. However, with the capability of low-loss (or no-loss) training using the quench protection methods described above, a magnet may be initially designed to have an operating current much nearer to critical current, reducing the overall magnet cost. Furthermore, the elimination of cryogen loss during quench greatly reduces operation costs over time, and the elimination of substantial heating in the magnet coils greatly reduces re-cool downtime of the system.

One skilled in the art will appreciate that embodiments of the invention may be interfaced to and controlled by a computer readable storage medium having stored thereon a computer program. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

Thus, in accordance with one aspect of the invention, a superconducting magnet assembly comprises a plurality of superconducting magnet coil portions connected in series to form a coil series circuit within a vessel to provide a magnetic field, a power supply coupled to the plurality of superconducting magnet coil portions to supply power to the plurality of superconducting magnet coil portions during a magnet ramp mode of operation, and a ramp switch disposed within the vessel and coupled to the plurality of superconducting magnet coil portions, wherein the ramp switch is configured to be open during a magnet ramp mode of operation and closed during a persistent mode of operation. The superconducting magnet assembly further comprises a dump resistor disposed externally to the vessel, wherein the dump resistor is connectable by the ramp switch to the plurality of superconducting magnet coil portions, and a controller coupled to at least one superconducting magnet coil portion and the ramp switch, wherein the controller is configured to detect a quench onset condition based upon a signal detected from the at least one superconducting magnet coil portion and to open the ramp switch upon detection of the quench onset condition in order to dump magnet energy to the dump resistor.

In accordance with another aspect of the invention, a method of protecting a superconducting magnet assembly during a quench condition is disclosed, the method comprising coupling a controller to at least one superconducting magnet coil portion disposed within a vessel, connecting the at least one superconducting magnet coil portion to a power supply during a magnet ramp mode of operation and connecting the at least one superconducting magnet coil portion to a dump resistor during a persistent mode of operation, and monitoring signal from at least one superconducting magnet coil portion to detect the onset of a quench condition. The method further comprises detecting the quench condition based on the monitored signal, and sending a signal from the controller to a ramp switch coupled to the at least one superconducting magnet coil portion to open the ramp switch if a quench condition is detected by the controller in order to discontinue a persistent mode of operation and in order to connect the at least one superconducting magnet coil portion to the dump resistor.

In accordance with yet another aspect of the invention, a magnetic resonance imaging system is disclosed, the system comprising a superconducting magnet coil assembly disposed within a vessel, a power supply disposed externally to the vessel, wherein the power supply is removably coupleable to the superconducting magnet coil assembly via permanently embedded leads in the vessel, and a ramp switch disposed within the vessel and coupled to the superconducting magnet coil assembly, wherein the ramp switch is configured to be open during a magnet ramp mode of operation and closed during persistent mode of operation. The magnetic resonance imaging system further comprises an external dump resistor disposed externally to the vessel, wherein the external dump resistor is coupled to the superconducting magnet coil assembly via cables coupled to the permanently embedded leads in the vessel, and a quench protection controller disposed externally to the vessel and coupled to the superconducting magnet coil assembly and the ramp switch, wherein the quench protection controller is configured to detect a quench condition based upon measured signals of the superconducting magnet coil assembly and to open the ramp switch in order to dump magnet energy to the external dump resistor when a quench condition is detected.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A superconducting magnet assembly comprising:
   a plurality of superconducting magnet coil portions connected in series to form a coil series circuit within a vessel to provide a magnetic field;
   a power supply coupled to the plurality of superconducting magnet coil portions to supply power to the plurality of superconducting magnet coil portions during a magnet ramp mode of operation;
   a ramp switch disposed within the vessel and coupled to the plurality of superconducting magnet coil portions, wherein the ramp switch is configured to be open during a magnet ramp mode of operation and closed during a persistent mode of operation;
   a dump resistor disposed externally to the vessel, wherein the dump resistor is connectable by the ramp switch to the plurality of superconducting magnet coil portions; and
   a controller coupled to at least one superconducting magnet coil portion and the ramp switch, wherein the controller is configured to detect a quench onset condition based upon a signal detected from the at least one superconducting magnet coil portion and to open the ramp switch upon detection of the quench onset condition in order to dump magnet energy to the dump resistor.

2. The superconducting magnet assembly of claim 1 further comprising a relay switch, wherein the relay switch is configured to couple the power supply to the plurality of superconducting magnet coil portions during the magnet ramp mode of operation and couple the dump resistor to the plurality of superconducting magnet coil portions during the persistent mode of operation.

3. The superconducting magnet assembly of claim 2 wherein the relay switch is further coupled to the controller, and wherein the controller is configured to manipulate the relay switch to couple the dump resistor to the plurality of superconducting magnet coil portions when a quench onset condition is detected during the magnet ramp mode of operation.

4. The superconducting magnet assembly of claim 1 further comprising at least a pair of power leads permanently embedded into the vessel, with the power supply and the dump resistor being coupled to the plurality of superconducting magnet coil portions via the at least a pair of power leads permanently embedded into the vessel.

5. The superconducting magnet assembly of claim 1 wherein the controller is coupled to the plurality of superconducting magnet coil portions and the ramp switch during both the magnet ramp mode of operation and the persistent mode of operation.

6. The superconducting magnet assembly of claim 1 wherein the controller is coupled to the plurality of superconducting magnet coil portions and the ramp switch during the magnet ramp mode of operation and decoupled from the plurality of superconducting magnet coil portions and the ramp switch during the persistent mode of operation.

7. The superconducting magnet assembly of claim 6 wherein both the controller and the power supply are removable from the superconducting magnet assembly after completion of the magnet ramp mode of operation.

8. The superconducting magnet assembly of claim 1 wherein the ramp switch further comprises a plurality of heaters configured to open the ramp switch based upon a maximum predetermined voltage level across the plurality of superconducting magnet coil portions during the persistent mode of operation.

9. The superconducting magnet assembly of claim 1 further comprising a plurality of detection sensors coupled to at least one superconducting magnet coil portion to communicate the signal corresponding to the onset of quench to the controller.

10. The superconducting magnet assembly of claim 1 wherein the vessel comprises a cryogen vessel including a cryogen therein to provide cooling to the plurality of superconducting magnet coil portions.

11. The superconducting magnet assembly of claim 1 wherein the plurality of superconducting magnet coil portions are electrically disconnected from the power supply when the ramp switch is closed during the persistent mode of operation.

12. A method of protecting a superconducting magnet assembly during a quench condition, the method comprising:
    coupling a controller to at least one superconducting magnet coil portion disposed within a vessel;
    connecting the at least one superconducting magnet coil portion to a power supply during a magnet ramp mode of operation and connecting the at least one superconducting magnet coil portion to a dump resistor during a persistent mode of operation, such that the at least one superconducting magnet coil portion is electrically disconnected from the power supply during the persistent mode of operation, but with current continuing to circulate through the at least one superconducting magnet coil portion during the persistent mode of operation such that the at least one superconducting magnet coil portion continues to operate;
    monitoring signal from at least one superconducting magnet coil portion to detect the onset of a quench condition;
    detecting the quench condition based on the monitored signal; and
    sending a signal from the controller to a ramp switch coupled to the at least one superconducting magnet coil portion to open the ramp switch if a quench condition is detected by the controller in order to discontinue a persistent mode of operation and in order to connect the at least one superconducting magnet coil portion to the dump resistor.

13. The method of claim 12 further comprising sending a signal from the controller to the relay switch to connect the at least one superconducting magnet coil portion to the dump resistor if a quench condition is detected during a magnet ramp mode of operation.

14. The method of claim 12 further comprising disconnecting the controller and the power supply from the at least one superconducting magnet coil portion after completion of a magnet ramp mode of operation.

15. The method of claim 12 further comprising opening the ramp switch via at least one heater in the ramp switch based upon a quench detection signal across the at least one superconducting magnet coil portion during the persistent mode of operation.

16. A magnetic resonance imaging system comprising:
a superconducting magnet coil assembly disposed within a vessel;
a power supply disposed externally to the vessel, wherein the power supply is removably coupleable to the superconducting magnet coil assembly via permanently embedded leads in the vessel;
a ramp switch disposed within the vessel and coupled to the superconducting magnet coil assembly, wherein the ramp switch is configured to be open during a magnet ramp mode of operation and closed during persistent mode of operation;
an external dump resistor disposed externally to the vessel, wherein the external dump resistor is coupled to the superconducting magnet coil assembly via cables coupled to the permanently embedded leads in the vessel; and
a quench protection controller disposed externally to the vessel and coupled to the superconducting magnet coil assembly and the ramp switch, wherein the quench protection controller is configured to detect a quench condition based upon measured signals of the superconducting magnet coil assembly and to open the ramp switch in order to dump magnet energy to the external dump resistor when a quench condition is detected.

17. The magnetic resonance imaging system of claim 16 further comprising a relay switch, wherein the relay switch is configured to couple the power supply to the superconducting magnet coil assembly during the magnet ramp mode of operation and couple the dump resistor to the superconducting magnet coil assembly during the persistent mode of operation.

18. The magnetic resonance imaging system of claim 17 wherein the relay switch is a mechanical device.

19. The magnetic resonance imaging system of claim 17 wherein the relay switch comprises power electronic components.

20. The magnetic resonance imaging system of claim 17 wherein the relay switch is further coupled to the quench protection controller, and wherein the quench protection controller is configured to manipulate the relay switch to couple the dump resistor to the superconducting magnet coil assembly when a quench condition is detected during the magnet ramp mode of operation.

21. The magnetic resonance imaging system of claim 16 wherein both the quench protection controller and the power supply are removable from the superconducting magnet coil assembly after completion of the magnet ramp mode of operation.

22. The magnetic resonance imaging system of claim 16 wherein the ramp switch further comprises a plurality of heaters configured to open the ramp switch based upon a maximum predetermined voltage level across the superconducting magnet coil assembly during the persistent mode of operation.

23. The magnetic resonance imaging system of claim 16 wherein the superconducting magnet coil assembly comprises a plurality of magnet coils coupled in series.

* * * * *